United States Patent
Ootsuki et al.

(10) Patent No.: US 6,462,470 B1
(45) Date of Patent: Oct. 8, 2002

(54) ORGANIC ELECTROLUMINESCENT DISPLAY WITH THREE KINDS OF LAYER-STACKED DEVICES

(75) Inventors: Shigeyoshi Ootsuki; Yoshikazu Yamaguchi, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/055,990

(22) Filed: Jan. 28, 2002

Related U.S. Application Data

(62) Division of application No. 09/481,875, filed on Jan. 12, 2000.

(30) Foreign Application Priority Data

Jan. 13, 1999 (JP) .................................. 11-006075

(51) Int. Cl.⁷ .......................... H01J 1/62; H05B 33/14; H05B 33/26
(52) U.S. Cl. ...................... 313/504; 313/500; 313/505; 313/506; 313/512; 495/24
(58) Field of Search .................................. 313/504, 502, 313/503, 505, 506, 512; 445/24

(56) References Cited

U.S. PATENT DOCUMENTS

| | | | |
|---|---|---|---|
| 5,126,214 A | 6/1992 | Tokailin et al. ............. | 428/690 |
| 5,294,869 A | 3/1994 | Tang et al. ................. | 313/504 |
| 5,679,472 A | 10/1997 | Wu et al. ................... | 313/505 |
| 5,688,551 A * | 11/1997 | Littman et al. ............. | 313/502 |
| 5,804,917 A * | 9/1998 | Takahashi et al. ........... | 313/500 |
| 6,091,194 A * | 7/2000 | Swirbel et al. ............. | 313/498 |

FOREIGN PATENT DOCUMENTS

| | | | |
|---|---|---|---|
| JP | 1-313892 | 12/1989 | .......... H05B/33/04 |
| JP | 3-141588 | 6/1991 | .......... H05B/33/26 |
| JP | 3-152897 | 6/1991 | .......... H05B/33/14 |
| JP | 5-3077 | 1/1993 | .......... H05B/33/10 |
| JP | 5-3079 | 1/1993 | .......... H05B/33/14 |
| JP | 5-121172 | 5/1993 | .......... H05B/33/26 |
| JP | 7-6875 | 1/1995 | .......... H05B/33/14 |
| JP | 7-153573 | 6/1995 | .......... H05B/33/14 |
| JP | 8-96959 | 4/1996 | .......... H05B/33/20 |
| JP | 8-185983 | 7/1996 | .......... H05B/33/26 |
| JP | 10-171374 | 6/1998 | ............. G09F/9/30 |
| JP | 10-208877 | 8/1998 | .......... H05B/33/06 |
| JP | 10-255976 | 9/1998 | .......... H05B/33/14 |

* cited by examiner

Primary Examiner—Ashok Patel
Assistant Examiner—Sikha Roy
(74) Attorney, Agent, or Firm—Foley & Lardner

(57) ABSTRACT

A transparent electrode and a hole transporting layer are formed on an anode board. Three kinds of layer-stacked devices each emitting light having one of primary colors of red, green and blue, composed of a metal strip and an organic electroluminescent layer covering around the metal strip are then formed. These layer-stacked devices are mounted on an insulation board in a manner that the organic electroluminescent layer faces upward. Then, the anode board and the insulation board are overlaid each other so that the transparent electrode intersects the layer-stacked device and that the hole transporting layer and the organic electroluminescent layer are opposed to each other.

4 Claims, 3 Drawing Sheets

ORGANIC ELECTROLUMINESCENT DISPLAY WITH THREE KINDS OF LAYER-STACKED DEVICES

CROSS-REFERENCE TO RELATED PATENT APPLICATIONS

This application is a division of application Ser. No. 09/481,875, filed Jan. 12, 2000, now pending, and based on Japanese Patent Application No. 11-006075, filed Jan. 13, 1999, by Shigeyoshi OOTSUKI and Yoshikazu YAMAGUCHI. This application claims only subject matter disclosed in the parent application and therefore presents no new matter.

BACKGROUND OF THE INVENTION

1. Field of the Invention

The present invention relates to an organic electroluminescent display device (hereinafter referred to as an "organic EL display device") fabricated by using an organic electroluminescent layer (hereinafter referred to an "organic EL layer") and to a method for manufacturing the same.

2. Description of the Related Art

An organic electroluminescent device is comprised of an anode, a cathode and an ultra thin-film organic EL layer composed of an organic electroluminescent compound disposed between the anode and the cathode. When a voltage is applied between the anode and the cathode, a hole and an electron from the anode and the cathode are injected respectively into the organic EL layer and are recombined therein. At this point, energy is produced which causes a molecule of an organic electroluminescent compound constituting the organic EL layer to be pumped and electroluminescence occurs while the pumped molecule is deactivated to a ground state. The organic EL display device is a layer-stacked device utilizing this electroluminescent phenomenon.

The organic EL layer has a single layer structure or a multi-layered structure containing at least one of organic layers including an organic layer called an organic electroluminescent layer which emits light when holes and electrons are combined therein, an organic layer called a hole transporting layer into which holes are easily injected and in which electrons are hardly moved, and an organic layer in which electrons are easily injected and in which holes are hardly moved.

The thin-film constituting the organic EL device is ordinarily formed by a vacuum evaporation method and a thickness of the film is not more than 1 m. There is, however, a problem in that, if water, acids or alkali solutions are used while these thin films are formed, since they soak into an interface between organic EL layers, and also between the organic EL layer and the cathode, electroluminescent performance and life characteristics of the organic EL layer are remarkably degraded.

Therefore, photolithography using a conventionally known wet-etching technique can not be used for high definition separating process of the organic EL layer.

Moreover, a dry-etching technique also cannot be used because a solvent, developer or release agent used for this technique may cause damage to the organic EL layer or the cathode during processes of applying a resist, of development and of releasing.

To manufacture a color display device using such organic EL devices, roughly three kinds of methods are available conventionally.

A first method is to use an organic EL device emitting white light which passes through a color filter having primary colors to achieve color displaying. The color displaying technology using such white layer-2 stacked devices and color filters is disclosed in, for example, Japanese Laid-open Patent Application No. Hei8-96959.

This first method disclosed above is the same in terms of technological principles as that used widely for transmission type color liquid crystal displays. Moreover, according to this method disclosed, a color filter with high definition can be easily implemented by using photolithography technology and a patterning of the organic layer is not required if only one kind of the organic EL device to emit white light is prepared. Therefore, there is an advantage in that color display devices can be easily manufactured by this method.

However, the above first method has a disadvantage in that, since light having an unwanted wavelength is removed from emitted white light with a filter, a major portion of the light emitted from the organic EL device is discarded wastefully, thus making it difficult to effectively utilize the electro-luminescence of the organic EL device.

Furthermore, to put this first method to practical use, it is necessary to develop white electroluminescent organic materials having a high electroluminescent efficiency rate and a long life, however, the actual development of such organic materials is extremely difficult.

A second method is to use a color conversion technique employing a blue electroluminescent organic EL device and color conversion layers. A color display technique of the organic EL device using this color conversion method is disclosed in, for example, Japanese Laid-open Patent Application No. Hei3-152897.

In this color conversion method disclosed, blue light with a short wavelength is produced by using the organic EL device and then green light and red light each having a wavelength longer than that of the blue light is produced by causing the blue light to pass through the color conversion layer. If this method is used, it is not necessary to scale down the organic EL device and the color conversion layer with high definition can be implemented by using photolithography, thus enabling easy fabrication of the color display device with high definition.

However, this second method also has a disadvantage that it is very difficult to actually increase the conversion rate of the color conversion layer and therefore the efficiency rate of effectively using electroluminescence of the organic EL device is low.

Moreover, in this second method, it is also difficult to obtain flatness of a surface of the color conversion layer when its patterning is carried out and it is difficult to carry out the patterning of a flattened layer without breaking the transparent electrodes.

To overcome such shortcomings as described above in implementing color display devices, a method for effectively using electroluminescence of the organic EL device for displaying is proposed in which organic EL devices each having one of primary colors of red, green and blue are formed independently and arranged.

SUMMARY OF THE INVENTION

In view of the above, it is an object of the present invention to provide an organic electroluminescent display device and a method for manufacturing the same wherein a patterning of the organic electroluminescent layer can be carried out without a process of photolithography or metal masking and wherein the patterning of large area and/or with high definition is made possible.

According to a first aspect of the present invention, there is provided a method for manufacturing an organic electroluminescent display device comprising:

a first process of forming a patterned transparent electrode on an anode board;

a second process of forming a hole transporting layer on said transparent electrode;

a third process of forming three kinds of layer-stacked devices by sequentially stacking a metal cathode, organic electroluminescent layers each emitting red, green or blue color light on a surface of a piece of strip-like metal;

a fourth process of arranging the above three kinds of layer-stacked devices with each of the organic electroluminescent layers facing upward on an insulation board;

a fifth process of overlaying the anode board and the insulation board each other so that the transparent electrode and the layer-stacked devices intersect each other and that the hole transporting layer and the organic electroluminescent layer are opposed to each other; and a sixth process of making sealing around the anode board and the insulation board being overlaid each other.

In the organic EL display device of this aspect of the present invention, the patterning of the organic electroluminescent layer constituting the layer-stacked device can be carried out without a process of photolithography or metal masking, thus allowing an easy production of color organic EL display devices. Moreover, since the patterning of the organic electroluminescent layer can be carried out without the use of a shadow mask such as a metal mask, the patterning of large area and/or with high definition is made possible.

In the foregoing, a preferable mode is one wherein the third process further comprises a step of stacking a metal cathode and an organic electroluminescent layer emitting red, green or blue light on a surface of a piece of strip-like metal to form the layer-stacked device. By forming the layer-stacked device, less materials become waste compared with cases of using the photolithography or metal masking, thus reducing production costs. Moreover, since the organic electroluminescent layer is separately evaporated for every electroluminescent color, a material for each electroluminescent color is not mixed during evaporation, thus avoiding mixing of colors. Also, each of defective layer-stacked devices can be individually replaced even in the course of manufacturing, thereby reducing losses caused by defective layer-stacked devices, increasing yield of products and resulting in the reduction of production costs. Furthermore, because a metal strip can be used as a cathode, wiring resistance for the cathode can be extremely lowered.

Also, a preferable mode is one that wherein the metal electrode has a low work function.

Furthermore, a preferable mode is one that wherein further comprises a step of forming bumps and dips on the surface of a piece of the metal to cause light to be reflected irregularly.

According to a second aspect of the present invention, there is provided an organic electroluminescent display device comprising:

a plurality of line-like transparent electrodes spreading in a first direction;

an anode board having a hole transporting layer formed on said transparent electrode;

an insulation board disposed opposite to said anode board; and three kinds of layer-stacked devices having organic electroluminescent layers each emitting a different color light, which are disposed between the anode board and the insulation board;

whereby each of the three kinds of layer-stacked devices is composed of a piece of strip-like metal, a metal cathode formed on a surface of a piece of the metal and organic electroluminescent layers, formed on the metal cathode, each emitting a red, green or blue color light, wherein the organic electroluminescent layers are arranged on the side of said anode board in a second direction in which a longitudinal direction of the organic electroluminescent layers intersects the first direction.

In the foregoing, it is preferable that the layer-stacked device is composed of a piece of strip-like metal, a metal cathode formed on a piece of the metal and an organic electroluminescent layer formed on the metal cathode emitting red, green or blue light.

Also, a preferable mode is one that wherein the metal electrode has a low work function.

Furthermore, it is preferable that bumps and dips are formed on a surface of a piece of the metal to cause light to be reflected irregularly.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
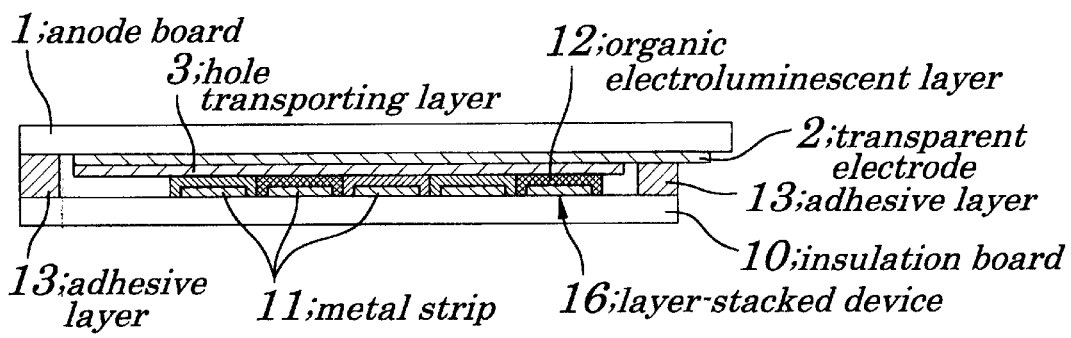
FIG. 1 is a longitudinal sectional view of an organic EL display device according to a first embodiment of the present invention.

FIG. 1 is a longitudinal sectional view of an organic EL display device according to a first embodiment of the present invention.

As shown in FIG. 1, the organic EL display device is comprised of an anode board 1, two or more line-like transparent electrodes 2 formed on the anode board 1, a hole transporting layer 3 formed on each of the transparent electrodes 2.

The line-like transparent electrodes 2 is adapted to spread in parallel with each other in the right and left direction on a paper showing FIG. 1. The organic EL display device of this embodiment is further comprised of an insulation board 10 on which a layer-stacked device 16 emitting light having one of primary colors is arranged.

Each layer-stacked device 16 is composed of a metal strip 11 spreading in a direction vertical to the paper showing FIG. 1, a metal cathode (not shown) formed around the metal strip 11 and an organic electroluminescent layer 12 composed of electroluminescent organic compounds formed on the metal cathode. A metal such as Li and Mg or the like, having a low work function, may preferably be used as the metal cathode in this embodiment.

The metal cathode and organic electroluminescent layer 12 cover the metal strip 11 so that one side of a surface of the metal strip 11 is exposed. Each of the layer-stacked devices 16 is attached to each of the insulation boards 10 in a manner that one side of a surface of the metal strip 11 is in touch with the insulation board.

Each of the layer-stacked devices 16 is mounted, by turns, on the insulation board 10 in the order of colors of red, green and blue.

The anode board 1 and the insulation board 10 are stacked together with an adhesive layer 13 interposed between the two boards such that the hole transporting layer 3 is in touch with the organic electroluminescent layer 12.

In the organic EL display device of this embodiment, the patterning of the organic electroluminescent layer 12 constituting the layer-stacked device 16 can be carried out without a process of photolithography or metal masking, thus allowing an easy production of color organic EL display devices.

Figure 7:
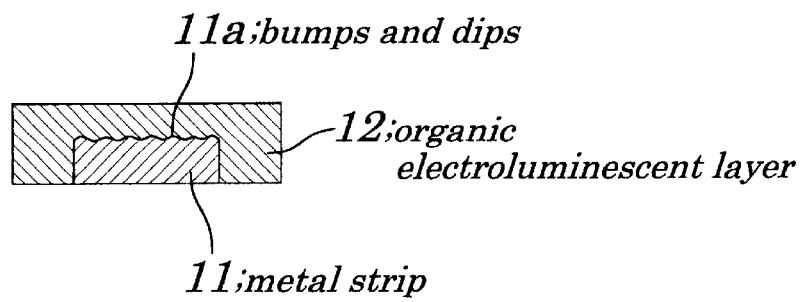
FIG. 7 is a sectional view illustrating a layer-stacked device used in an organic EL display device of a second embodiment of the present invention.

Moreover, as depicted in FIG. 7, bumps and dips 11a may be formed on a surface of the metal strip 11 constituting the layer-stacked device 16, which function as a light scattering layer causing light to be reflected irregularly. By providing such bumps and dips 11a functioning as the light scattering layer, external light radiated from the transparent electrode 2 does not reflect specularly but irregularly on the surface of the metal strip 11. As a result, external light from an illumination apparatus or sunlight can be prevented and the image contrast can be improved accordingly.

Figure 2:
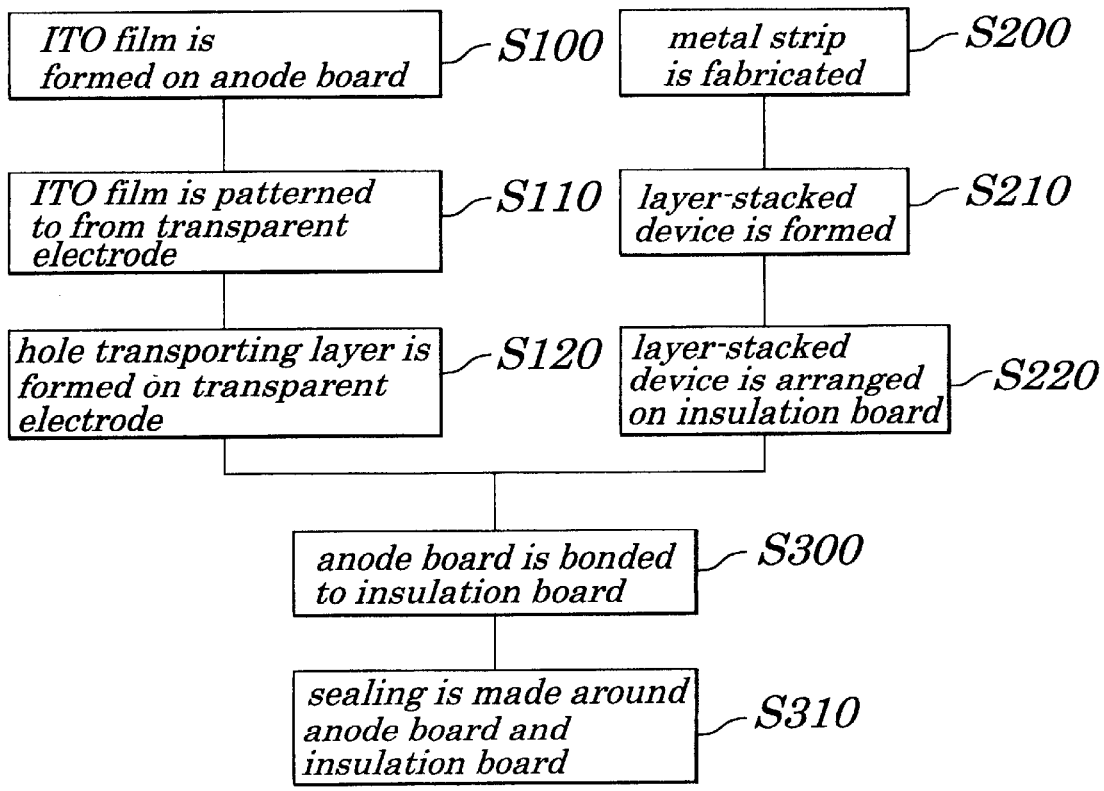
FIG. 2 is a flow chart showing a method of manufacturing the organic EL display device of FIG. 1.

A method of manufacturing the organic EL display device of this embodiment shown in FIG. 1 is hereafter described. FIG. 2 is a flow chart showing the method of manufacturing the organic EL display device of FIG. 1.

Figure 3:
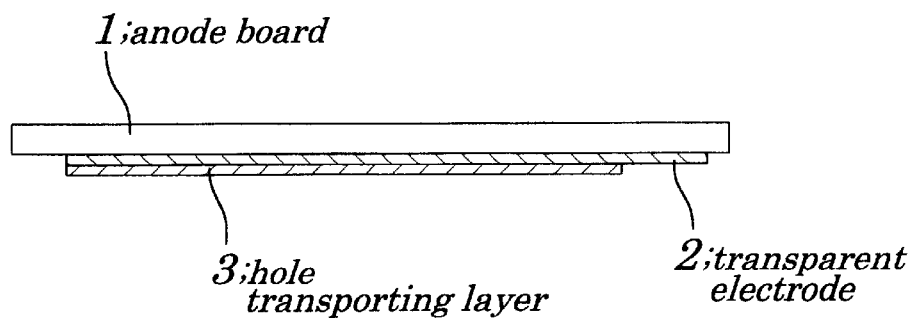
FIG. 3 is a sectional view illustrating an anode board used in the organic EL display device of the first embodiment of the present invention.

First, as shown in FIG. 3, an ITO (indium tin oxide) film is formed on the anode board 1 composed of plate glass with a thickness of 0.3 mm to 1.1 mm using a sputtering method in a manner that the thickness of the above film becomes about 50 nm to about 300 nm (refer to Step 100 in FIG. 2).

The plate glass is preferably non-alkali glass adapted to absorb less water such as 7059 or 1737 glass from Corning Co., however, unexpensive low-alkali glass or soda-lime glass may be employed if sufficiently dried before use.

The ITO film formed on the glass board 1 is patterned using a wet-etching method of photolithography so that each of the patterned films is of a strip shape to allow it to spread in the longitudinal direction (in the right and left directions in FIG. 3), each being disposed at intervals to form the transparent electrode 2 (Step 110 in FIG. 2).

A patterned shape of the ITO film can be selected arbitrarily. For example, according to this embodiment, a width of each transparent electrode 2 is 330 m and an interval between transparent electrodes 2 is 30 m.

The anode board 1 having the patterned transparent electrode 2 is put into a vacuum evaporation system, with the transparent electrode 2 facing downward. That is, each of the transparent electrodes 2 is adapted to face an evaporation source. Then, N,N'-diphenyl-N,N'-bis(-naphthyl)-1,1'-biphenyl-4,4'-diamine (hereafter referred to as "-NPD" being a hole-transportable organic compound is weighed and put into a resistance heating board or a crucible. A heater is built in the resistance heating board or crucible. Air is exhausted from the vacuum evaporation system using a vacuum pump so that the pressure therein becomes about $1 \times 10^{-4}$ Pa.

Figure 4:
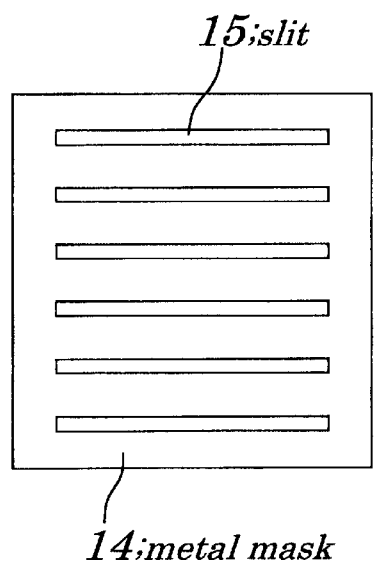
FIG. 4 is a top view of a metal mask for the organic EL display device of the first embodiment of the present invention.

Then, as depicted in FIG. 4, a metal mask 14 is put between the anode board 1 and the evaporation source so that it is fixed to the anode board 1. Also, in FIG. 4, two or more slits 15 are formed on the metal mask 14 by quadrangularly cutting an area of the metal mask 14. Each slit 15 is so positioned that the slit 15 and the transparent electrode 2 overlap each other when the metal mask 14 is overlaid on the anode board 1.

After the metal mask 14 is disposed between the anode board 1 and the evaporation source 17, a current is passed through the heater built in the resistance heating board or the crucible, with —NPD being put therein, and —NPD is heated and evaporated on the transparent electrode 2 so that the thickness of the —NPD film becomes 50 nm.

Thus, the hole transporting layer 3 is formed by causing —NPD to be evaporated on the transparent electrode 2 (Step 120 in FIG. 2).

Next, a metal strip 11 with a thickness of about 20 m and a width of about 100 m is fabricated (Step 200 in FIG. 2).

Figure 5:
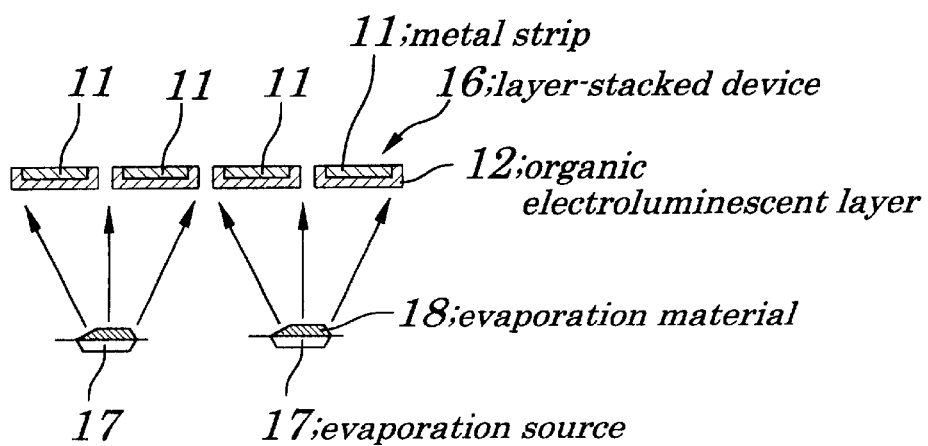
FIG. 5 is a front view including a partially sectional view illustrating a process of forming a layer-stacked device.

As shown in FIG. 5, after the metal strip 11 is put into the vacuum evaporation system, by heating an evaporation material 18 contained in the evaporation source 17, the evaporation material is evaporated on a metal cathode (not shown), the organic electroluminescent layer and the metal strip 11, resulting in the formation of the layer-stacked device 16 (Step 210 in FIG. 2).

The metal strip 11 is fabricated by rolling, for example, a copper cable with a diameter of about 50 m using a rolling machine.

Metal other than copper, if electrically conductive, may be used as a material for the metal strip 11. It includes iron, silver, gold, aluminum, chromium, cobalt, tin, nickel, platinum or an alloy thereof.

The method of processing metal so as to have a strip shape is not limited to a rolling method of materials for lines. For example, it may include a method of cutting a thin-plate, using a mold and of pulling out molten metal from a fine and long hole.

The metal cathode is fabricated in such a manner as described below. First, after aluminum is put into the resistance heating board or crucible, the evaporation of aluminum on the metal strip 11 is carried out within the vacuum evaporation system so that a thickness of the aluminum film becomes 50 nm. Then, lithium and aluminum separately put into the resistance heating board or crucible are heated at the same time to be co-evaporated on the metal cathode so that a thickness of the resulting film becomes 20 nm. Thus, the metal cathode having a structure, in which an aluminum film is stacked on top of a film composed of a mixture of lithium and aluminum, is formed. After the metal cathode is formed, tris(8-quinolinolato) aluminum complex (hereinafter referred to "Alq3") is weighed and put into the resistance heating board or crucible. By the same method as described above, Alq3 is heated by a heater to be evaporated so that a thickness of the Alq3 film becomes 50 nm.

Thus, a layer-stacked device for emitting green light 16G, in which the metal cathode fabricated by co-evaporation of aluminum and the mixture of aluminum and lithium is stacked on top of the organic electroluminescent layer emitting green light 12, is formed on the metal strip 11.

As an organic compound constituting the organic electroluminescent layer, Alq3 and 4-dicyanomethylene-2-methyl-6-(p-dimethylaminostyryl)-4H-pyran (hereafter referred to as "DCM") are employed. Alq3 and DCM are co-evaporated on a metal cathode of each metal strip 11. Each of Alq3 and DCM is individually provided from each evaporation source. The co-evaporation is made in a manner that ALq3 contains 5% by weight of DCM. The evaporation is continued until a thickness of the film on the organic electroluminescent layer 12 becomes about 50 nm. Thus, a layer-stacked device for emitting red light 16R is formed.

Similarly, perylene is used as an organic compound constituting an organic electroluminescent layer 12. Perylene is weighed and put into the resistance heating board or crucible. By heating it by a heater, perylene is evaporated on a metal cathode of each metal strip 11 until a thickness of its film becomes about 50 nm. Thus, a layer-stacked device for emitting blue light 16B is formed as well.

Figure 6:
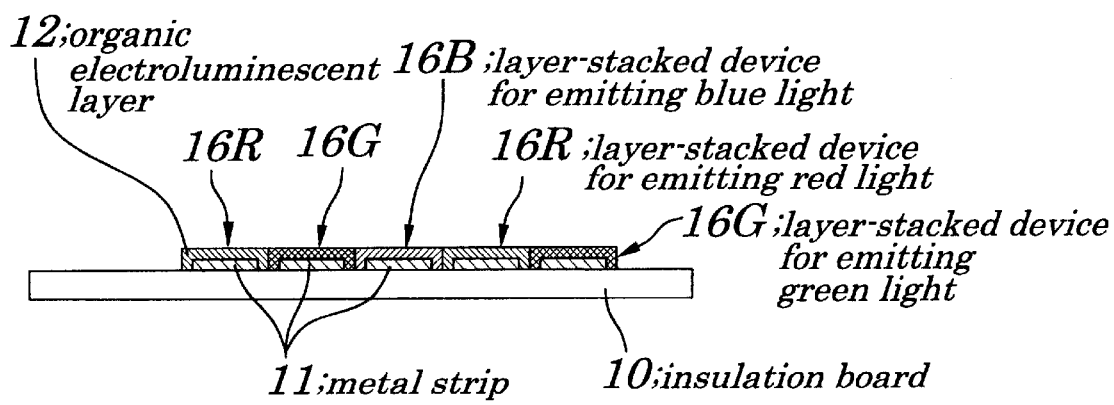
FIG. 6 is a sectional view of an insulation board used in the organic EL display device of the first embodiment of the present invention.

As shown in FIG. 6, the organic electroluminescent layer 12 constituting the layer-stacked device 16 is mounted on the insulation board 10. An exposed face of each metal strip 11 constituting the layer-stacked device 16 is adapted to be in touch with the insulation board 10. Each of the layer-stacked device s 16R, 16G and 16B is arranged on the insulation board 10 in a predetermined order of colors of red, green, blue, red, green and blue and so on (Step 220 in FIG. 2).

An adhesive is applied in advance to the insulation board 10 and each layer-stacked device 16 is adhered to the insulation board 10, with the adhesive disposed therebetween.

As depicted in FIG. 1, the hole transporting layer 3 is mounted on each of the layer-stacked device s 16R, 16G and 16B, and the anode board 1 is then mounted on the insulation board 10, with the transparent electrode disposed therebetween, in which the transparent electrode intersects the metal strip 11 (Step 300 in FIG. 2). That is, according to this embodiment, the transparent electrodes 2 spread in the right and left directions on the paper showing FIG. 3 while the metal strips 11 spread in the vertical direction on the paper showing FIG. 6, resulting in the intersection of the transparent electrode 2 and the metal strip 11. Thus, the transparent electrode 2 and the metal strip 11 are formed in a matrix manner. The anode board 1 is bonded to the insulation board 10 by the adhesive layer 13. Then, sealing is made around the anode board 1 and insulation board 10 (Step 310 in FIG. 2).

Next, operations of the organic EL display device according to this embodiment are described below. When a voltage is applied between the metal strip 11 and the transparent electrode 2 so that the metal cathode is at a relatively negative potential, a hole and an electron are injected from the transparent electrode 2 and from the metal strip 11 into the organic electroluminescent layer 12 respectively. The hole and electron are re-combined within the organic electroluminescent layer 12 and pump molecules constituting the organic electroluminescent layer 12. When such pumped molecules are returned to a ground state, electroluminescence occurs.

Accordingly, by supplying a signal sequentially scanning the metal cathode to make the same at a negative potential and further by matching timing of scanning of the metal cathode to that of scanning of the clearing electrode 2 and by feeding a signal corresponding to display data, an image corresponding to the display data can be displayed.

Also, by setting a period in which a cathode is scanned to 60 hertz, the image is recognized to be a continuous moving image owing to an afterimage of eyes of a human.

Furthermore, since the colors of light emitted from layer-stacked devices 16R, 16G and 16B constitute primary colors, a full color display can be possible by adjusting the brightness of each of the above layer-stacked devices. To adjust the brightness, methods are available including control on a current value flowing through each of layer-stacked devices 16R, 16G and 16B, pulse width modulation by which a time width of the display data is changed, or the like.

In the method for manufacturing the organic EL display device described above, the transparent electrode 2 and the hole transporting layer 3 are formed first on the anode board 1 and then each layer-stacked device 16 is formed on the insulation board 10, however, this fabrication order may be changed arbitrarily, i.e., each layer-stacked device 16 is firstly formed on the insulation board 10 and then the transparent electrode 2 and the hole transporting layer 3 may be formed on the anode board 1.

As described above, according to the method for manufacturing the organic EL display device of the present invention, the patterning of the organic electroluminescent layer 12 can be carried out without using methods such as photolithography or metal masking, thus allowing easy fabrication of a color organic EL display device.

Since the layer-stacked device 16 to be formed by stacking the metal cathode and organic electroluminescent layer 12 on the fine and long metal strip 11 is manufactured by vacuum evaporation for every electroluminescent color, less materials become waste compared with cases of using photolithography or metal masking, thus reducing production costs.

Moreover, since the organic electroluminescent layer 12 is separately evaporated for every electroluminescent color, a material for each electroluminescent color is not mixed during evaporation, thus avoiding mixing of colors.

Each of defective layer-stacked devices 16 can be individually replaced even in the course of manufacturing, thereby reducing losses caused by defective layer-stacked device s, increasing yield of products and resulting in the reduction in production costs.

Furthermore, because a metal strip can be used as a cathode, wiring resistance for the cathode can be extremely lowered.

Second Embodiment

Figure 8:
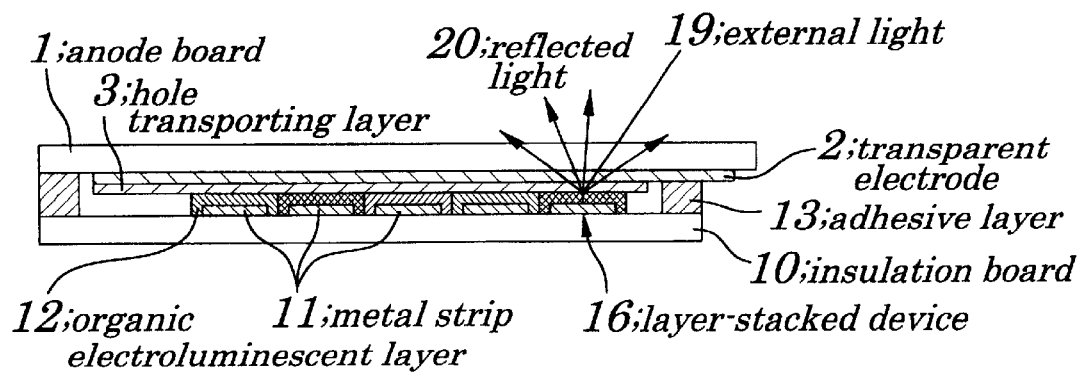
FIG. 8 is a sectional view showing the organic EL display device according to the second embodiment of the present invention.

FIG. 7 is a sectional view illustrating a layer-stacked device used in an organic EL display device of a second embodiment of the present invention. FIG. 8 is a sectional view showing the organic EL display device according to the second embodiment of the present invention.

As shown in FIG. 7, in the organic EL display device of this embodiment, a surface facing toward the anode board 1 of the metal strip 11 is not smooth and bumps and dips 11a are formed. As depicted in FIG. 8, external light, while being incident on the bumps and dips, is reflected irregularly.

The bumps and dips 11a on the surface of the metal strip 11 can be formed by in advance providing bumps and dips on the surface of one roller while the metal strip 11 is being rolled with a rolling machine.

The organic EL display device of the second embodiment has the same configuration as those of the first embodiment except that the bumps and dips are formed on the surface of the metal strip 11 and can be manufactured in the same manner as in the first embodiment.

According to this embodiment, the surface facing toward the organic electroluminescent layer 12 of the metal strip 11 has a light scattering property and accordingly external light 19 radiated from the transparent electrode 2 is reflected not specularly but irregularly. As a result, external light from an illumination apparatus or sunlight can be prevented and excellent image contrast can be obtained accordingly.

As described above, according to the present invention, the patterning of the organic medium constituting the layer-stacked device can be carried out without the use of methods such as the photolithography or metal masking, thus allowing easy fabrication of a color organic EL display device.

Also, since the patterning of the organic electroluminescent layer can be carried out without the use of a shadow mask such as a metal mask, the patterning of large area and/or with high definition is made possible.

Furthermore, in this method, the patterning is carried out by putting the shadow mask including the metal mask between the board and the evaporation source and by causing a substance to be evaporated to be passed through an opening of the shadow mask and to be accumulated on the board. Therefore, loss of electroluminescence is reduced because light produced by the organic EL device does not pass through a filter or the color conversion layer, which therefore allows the color display device using the organic EL device to be implemented at a high conversion rate.

However, this method has a big disadvantage that, since the wet-etching process cannot be used as a method for independently arranging the organic EL devices emitting light each having one of primary colors, the patterning has to be carried out by using the shadow mask including the metal mask, thus making it impossible to implement the patterning of large area and/or with high definition.

It is thus apparent that the present invention is not limited to the above embodiments but may be changed and modified without departing from the scope and spirit of the invention.

Finally, the present application claims the priority of Japanese Patent Application No. Hei 11-006075 filed on Jan. 13, 1999, which is herein incorporated by reference.

What is claimed is:

1. An organic electroluminescent display device comprising:

a plurality of line-like transparent electrodes spreading in a first direction;

an anode board having a hole transporting layer formed on said transparent electrode;

an insulation board disposed opposite to said anode board; and three kinds of layer-stacked devices having organic electroluminescent layers each emitting a different color light, which are disposed between said anode board and said insulation board;

whereby each of said three kinds of layer-stacked devices is composed of a piece of strip-like metal, a metal cathode formed on a surface of a piece of said strip-like metal and organic electroluminescent layers, formed on said metal cathode, each emitting a red, green or blue color light, wherein said organic electroluminescent layers are arranged on the side of said anode board in a second direction in which a longitudinal direction of said organic electroluminescent layers intersects said first direction.

2. The organic electroluminescent display device according to claim 1, wherein said layer-stacked device is composed of a piece of strip-like metal, a metal cathode formed on a piece of said metal and an organic electroluminescent layer formed on said metal cathode emitting red, green or blue light.

3. The organic electroluminescent display device according to claim 1, wherein said metal electrode has a low work function.

4. The organic electroluminescent display device according to claim 2, wherein bumps and dips are formed on a surface of a piece of said metal to cause light to be reflected irregularly.

* * * * *